(12) United States Patent
Schreiber et al.

(10) Patent No.: US 8,817,367 B2
(45) Date of Patent: Aug. 26, 2014

(54) PLASMA ION ASSISTED DEPOSITION OF MO/SI MULTILAYER EUV COATINGS

(71) Applicant: Corning Incorporated, Corning, NY (US)

(72) Inventors: Horst Schreiber, Corning, NY (US); Jue Wang, Fairport, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/956,816

(22) Filed: Aug. 1, 2013

(65) Prior Publication Data

US 2013/0314773 A1 Nov. 28, 2013

Related U.S. Application Data

(62) Division of application No. 13/081,966, filed on Apr. 7, 2011, now Pat. No. 8,526,104.

(60) Provisional application No. 61/329,834, filed on Apr. 30, 2010.

(51) Int. Cl.
| | |
|---|---|
| *G02B 5/08* | (2006.01) |
| *C23C 14/58* | (2006.01) |
| *G03F 1/24* | (2012.01) |
| *G02B 5/28* | (2006.01) |
| *B82Y 40/00* | (2011.01) |
| *C23C 14/22* | (2006.01) |
| *B82Y 10/00* | (2011.01) |
| *C03C 17/36* | (2006.01) |

(52) U.S. Cl.
CPC ............ *G02B 5/283* (2013.01); *C03C 17/3636* (2013.01); *C23C 14/5833* (2013.01); *G03F 1/24* (2013.01); *B82Y 40/00* (2013.01); *C23C 14/5873* (2013.01); *C23C 14/22* (2013.01); *B82Y 10/00* (2013.01); *G02B 5/0891* (2013.01)
USPC ......................................................... 359/360

(58) Field of Classification Search
None
See application file for complete search history.

(56) References Cited

U.S. PATENT DOCUMENTS

| | | | |
|---|---|---|---|
| 7,229,532 B2 | 6/2007 | Ando et al. | |
| 7,465,681 B2 | 12/2008 | Hart et al. | |
| 7,599,112 B2 | 10/2009 | Shiraishi | |
| 2009/0141358 A1 | 6/2009 | Cangemi et al. | |

OTHER PUBLICATIONS

Schott. Zerodur Zero Expansion Glass Ceramic. 2014. pp. 1-24.*

(Continued)

*Primary Examiner* — Derek S Chapel
(74) *Attorney, Agent, or Firm* — Kevin L. Bray; Walter M. Douglas

(57) ABSTRACT

The disclosure is directed to multilayer Mo/Si coatings for reflective mirrors used in extreme ultraviolet lithographic systems and to a method of making such mirrors using plasma ion assisted deposition (PIAD) techniques. The coating are deposited on a substrate suitable for EUV lithography, and are Mo/Si coating consisting of 40-100 Mo/Si periods, each period consisting on a Mo layer followed by a Si layer. Each of the individual Mo and Si layers is deposited to a specified or target thickness in the range of 2 nm to 5 nm, and the thicknesses are controlled to ±0.1 nm. A plasma from a plasma source is used to densify and smooth the substrate prior to deposition of the coating, and each layer of the coating is plasma densified and smoothed.

3 Claims, 5 Drawing Sheets

(56) References Cited

OTHER PUBLICATIONS

Zerodur K20: Glass ceramic with low thermal expansion for high temperature applications. Schott. <www.us.schott.com/advanced_optics>. 2014.*

Zerodur—Extremely low Expansion Glass Ceramic. Schott. <www.us.schott.com/advanced_optics>. 2014.*

Sasa Bajt et al, "Investigation of the Amorphous-To-Crystalline Transition in Mo/Si Multilayers"; Journal of Applied Physics, vol. 90, No. 2, 2001, pp. 1017-1025.

Nicolas Benoit et al, "Extreme-Ultraviolet-Induced Oxidation of Mo/Si Multilayers"; Applied Optics, vol. 47, No. 19, 2008, pp. 3455-3462.

Jue Wang et al; "Crystal Phase Transition of $HfO_2$ Films Evaporated by Plasma-Ion-Assisted Deposition"; Applied Optics, vol. 47, No. 13, 2008, pp. C189-C192.

Jue Wang et al; "Elastic and Plastic Relaxation of Densified $SiO_2$ Films"; Applied Optics, vol. 47, No. 13, 2008, pp. C131-C134.

Jue Wang et al; "Wavefront Control of $SiO_2$-Based Ultraviolet Narrow-Bandpass Filters Prepared by Plasma Ion-Assisted Deposition"; Applied Optics 45 (2), (2007) pp. 175-179.

Wang et al; "Multilayers for the EUV and Soft X-Ray Region", SPIE vol. 5963, 59630S-1 (2005).

Voorma et al; "Fabrication and Analysis of Extreme Ultriviolet Reflection Masks With Patterned W/C Absorber Bilayers"; J. Vac. Sci. Technology B 15 (2) Mar./Apr. 1997 p. 293-298.

Nedelcu et al; "Interface Roughness in MO/SI Multilayers"; Sciencedirect Thin Solid Films 515 (2006) 434-438.

Anopchenko et al; "Effect of Substrate Heating and Ion Beam Polishing on the Interface Quality in MO/SI Multilayers—XRay Comparative Study" Physics B 305 (2001) 14-20.

Louis et al; "Enhancement of Reflectivity of Multilayer Mirrors for Soft X-Ray Projection Lithography by Temperature Optimization and Ion Bombardment"; Microelectronic Engineering Jan. 23, 1994 Nos. 1/4 p. 215-218.

\* cited by examiner

Figure 7
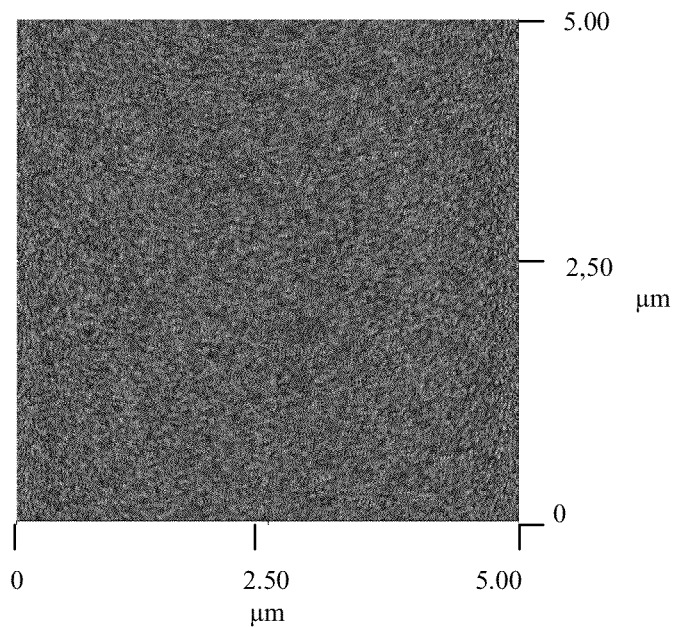
Figures 8a and 8b
Figure 8a
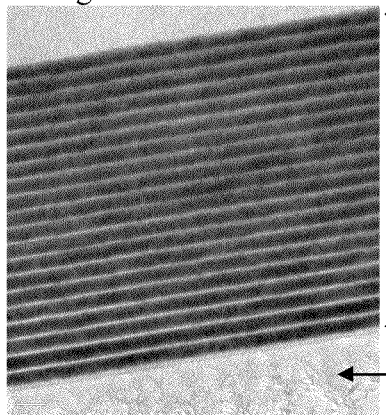
Figure 8b
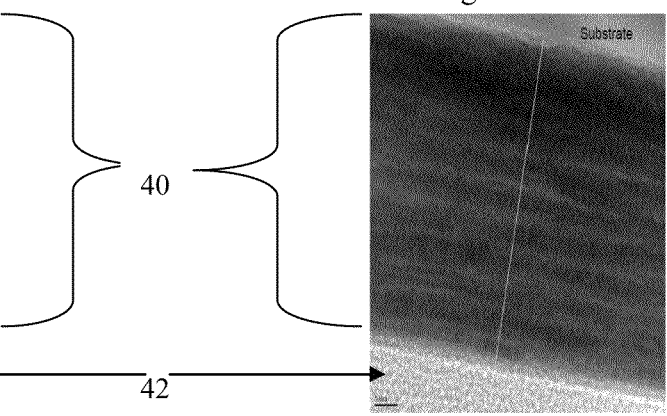

PLASMA ION ASSISTED DEPOSITION OF MO/SI MULTILAYER EUV COATINGS

CROSS-REFERENCE TO RELATED APPLICATIONS

This application is a divisional U.S. patent application Ser. No. 13/081966 filed on Apr. 7, 2011, the content of which is relied upon and incorporated herein by reference in its entirety, and the benefit of priority under 35 U.S.C. §120 is hereby claimed.

FIELD

The disclosure is directed to multilayer Mo/Si coatings for reflective mirrors used in extreme ultraviolet lithographic systems and to a method of making such mirrors using plasma ion assisted deposition (PIAD) techniques.

BACKGROUND

Development effort in extreme-ultraviolet (EUV) spectral region has been stimulated by the progress of the next generation lithography systems for the semiconductor industry. The formation of highly reflective multilayer coatings on substrates is one of the key techniques enabling the next generation EUV lithography systems because there are no optical materials that are transparent in the EUV region and all optics has to be reflective. Accordingly, there is considerable worldwide interest in mirrors with high reflectivity in the EUV. Among various coating material combinations that have been tried, Mo/Si based multilayer systems exhibit particularly high theoretical reflectivity. Due to the extremely short wavelengths used in the EUV region (approximately 10-15 nm, with 13.5 nm being the wavelength of choice), the individual layer thicknesses in the Mo/Si multilayer system are only a few nanometers, each layer ranging from approximately 2 nm to approximately 5 nm. Typically a total of approximately 60 periods is required for a high reflective Mo/Si system, wherein one period corresponds to a period of single layer of Mo and a single layer of Si. For example, FIG. 1 illustrates reflectance versus wavelength for a EUV high reflector designed to operate at 13.5 nm using a Mo/Si multilayer structure. FIG. 2 is a schematic drawing of the cross-sectional view of an EUV mirror having a plurality of Mo/Si periods, for example 60 periods, on a substrate 30, the substrate with the 60 periods being designated $30_{13}(Mo,Si)^{60}$. The individual layer thicknesses are Mo=2.8 nm for Mo and Si=4.2 nm, respectively, and the total number of individual layers is 120 consisting of 60 periods, each period having one Mo layer and one Si layer. FIG. 3 is a graph illustrating spectral reflectance shift due to a 0.3 nm Mo layer thickness reduction (decrease from 2.8 nm to 2.5 nm) in the 60-period Mo/Si system. The 0.3 nm thickness reduction leads to 0.55 nm center wavelength blue-shift; that is, the center wavelength shifts from 13.5 nm to 12.9 nm as a result of 0.3 nm thickness change of the Mo layers. Consequently, in view of the fact that small variances in the Mo layer thickness can cause a relatively large (~11%) shift in wavelength center), it is necessary to precisely control Mo/Si layer thicknesses when depositing the materials to form EUV mirrors so that the wavelength of the highly reflective coating remains centered at 13.5 nm. In addition, achievement of high reflectance at such a short wavelength as 13.5 nm requires a smooth surface and sharp interfaces at the sub-nanometer scale.

The challenges mentioned above in the making EUV coatings have led worldwide effort, primarily at research institutions, to find technical solutions for depositing qualified Mo/Si multilayer systems over the pass decade. Sasa Bajt et al (J. Appl. Phys., Vol. 90, No. (2) (2001), page 1017 et seq, of the Lawrence Livermore National Laboratory (LLNL) reported amorphous-to-crystalline transition in Mo/Si multilayers deposited by magnetron sputtering. Norbert Kaiser et al (SVC 51st Annual Technical Conference Proceedings, Vol. 53 (paper 20-08) of the Fraunhofer Institute and Zhanshan Wang et al of the Pohl Institute (Proceedings SPIE, Vol. 5963, (2005), paper 59630S-1) employed DC-magnetron sputtered Mo/Si multilayers for the EUV and soft X-ray optics. For larger size EUV optics, N. Benoit et al (Applied Optics, Vol. 47, No. 19 (2008), page 3455 et seq) of the Fraunhofer Institute installed a Kenotec DC-magnetron sputtering system in addition to Leybold DC-magnetron system described by Kaiser et al (op cit.) in their earlier work. As the need for EUV lithography becomes greater, the industry has started to accelerate Mo/Si multilayer development. For example, Kenji Ando et al at Canon Incorporated designed a new magnetron sputtering apparatus for EUV optics that is described in U.S. Pat. No. 7,229,532. Masayuki Shiraishi at Nikon has described the use of magnetron sputtering to make multilayer-film mirrors for lithography systems as has been described in U.S. Pat. No. 7,599, 112. While magnetron sputtering has thus been used to make optical coating for use in the EUV range optical coatings, and is the most commonly used deposition technique as shown by the work done at LLNL in the US, the Fraunhofer Institute in Germany, the Pohl Institute in China, and Nikon and Canon in Japan, there are disadvantages to the technique. Among the disadvantages to investing in a DC-magnetron sputtering system for EUV coating development are the high cost of ownership and low coating flexibility. Typical DC-magnetron sputtering systems have a multi-million dollar cost and the cost-of-ownership of magnetron sputtering system is also high; for example, the large size, high purity solid targets used in magnetron sputtering system are very expositive, the target surfaces need to be frequently refurbished, and the targets have to be frequently replaced. In contrast to magnetron sputtering, plasma ion assisted deposition (PIAD) is a well established coating technology. PIAD has been extensively used for oxide coatings (J. Wang et al in (a) Applied Optics Vol. 47, No. 13 (2008), pages C189-192; (b) Applied Optics, Vol. 46, No. 2 (2007), pages 175-179; and (c) Applied Optics, Vol. 47 No. 13 (2008) pages C131-134 and oxide-fluoride hybrid coatings. There are many technical advantages to the use of PIAD, for example, the low cost-of-ownership and high coating flexibility. In addition, it is very easy to change deposition materials, which enables one to use PIAD to support various projects simultaneously. However, it is believed that PIAD is only good for dielectric coatings such as oxide coating materials; there are technical roadblocks that restrict the PIAD for Mo/Si multilayer EUV coatings.

SUMMARY

The disclosure is directed to the use of PIAD (plasma-assisted ion deposition) to deposit Mo/Si multilayer films on substrates to form highly reflective surfaces for use in DUV lithography; for example, lithography using lasers operating at a wavelength in the range of 10-15 nm. The particular advantages to using PIAD technology for the deposition of Mo/Si films is that one can use reverse masks, the Mo and Si deposition rates can be precisely controlled, and the PIAD method permits in situ plasma smoothing and densification of the deposited Mo and Si layers.

The disclosure is further directed to method of depositing Mo/Si thin films on the surface of a substrate using plasma ion assisted deposition, the method having the steps of providing a vacuum chamber and within said chamber; providing a substrate on which a coating is to be deposited; providing at a Mo coating material source and a Si coating material source, and sequentially vaporizing said Mo material and said Si material using used an e-beam to provide a coating material vapor flux, said each of said coating material vapor flux passing from said material source through a reversed mask to said substrate; providing plasma ions from a plasma source; rotating said substrate at a selected rotation frequency f; sequentially depositing a layer of said Mo coating material and a layer of said Si coating material on said substrate to form a Mo/Si coating period and bombarding each of said coating layer and said period plasma ions at least during and after said material deposition process; and repeating said deposition step a plurality of time to form a Mo/Si coating having a plurality of periods on said substrate. In one embodiment the deposition and plasma bombardment step is repeated a plurality of times to form a MO/Si coating having 40-100 Mo/Si periods. The method can be used to deposit other materials for addition applications. For example, the method can be used to deposit high quality Au coatings as high reflective mirrors of $CO_2$ laser at 10.6µ for generating metal plasmas as light sources of EUV radiation. Exemplary substrate materials that can be used for the coatings described herein include fused silica glass, silica-titania glasses, for example, ULE® (Corning Incorporated, Corning, N.Y.), and ZERODUR® and Zerodur K20 (Schott North America, Elmsford, N.Y.).

BRIEF DESCRIPTION OF THE DRAWINGS

FIG. 7 AFM image of a 60-peiod Mo/Si multilayer deposited via the modified PIAD with a surface roughness of 0.18 nm.

FIGS. 8a and 8b are TEM photographs of Mo/Si multilayer coatings deposited used reverse masks having different size openings.

DETAILED DESCRIPTION

The disclosure is directed to the use of PIAD (plasma-assisted ion deposition) to deposit Mo/Si multilayer films on substrates to form highly reflective surfaces for use in DUV lithography; for example, lithography using lasers operating at a wavelength in the range of 10-15 nm. The particular advantages to using PIAD technology for the deposition of Mo/Si films is that one can use reverse masks, the Mo and Si deposition rates can be precisely controlled, and the PIAD method permits in situ plasma smoothing and densification of the deposited Mo and Si layers. The Mo and Si layers are deposited sequentially. For multi-period coatings having a Mo layer and a Si layer the process is repeated until the desired number of periods has been deposited. Herein, in the terms "d_Mo" and "d_Si," the "d" signifies that deposited layer has been densified as described herein. Thus, d_Mo=2.8 nm and d_Si=4.2 nm means densified Mo and Si layers having a thickness of 2.8 nm and 4.2 nm, respectively, that were densified by plasma ion bombardment.

A. The Use of Side Shields

Figure 4:
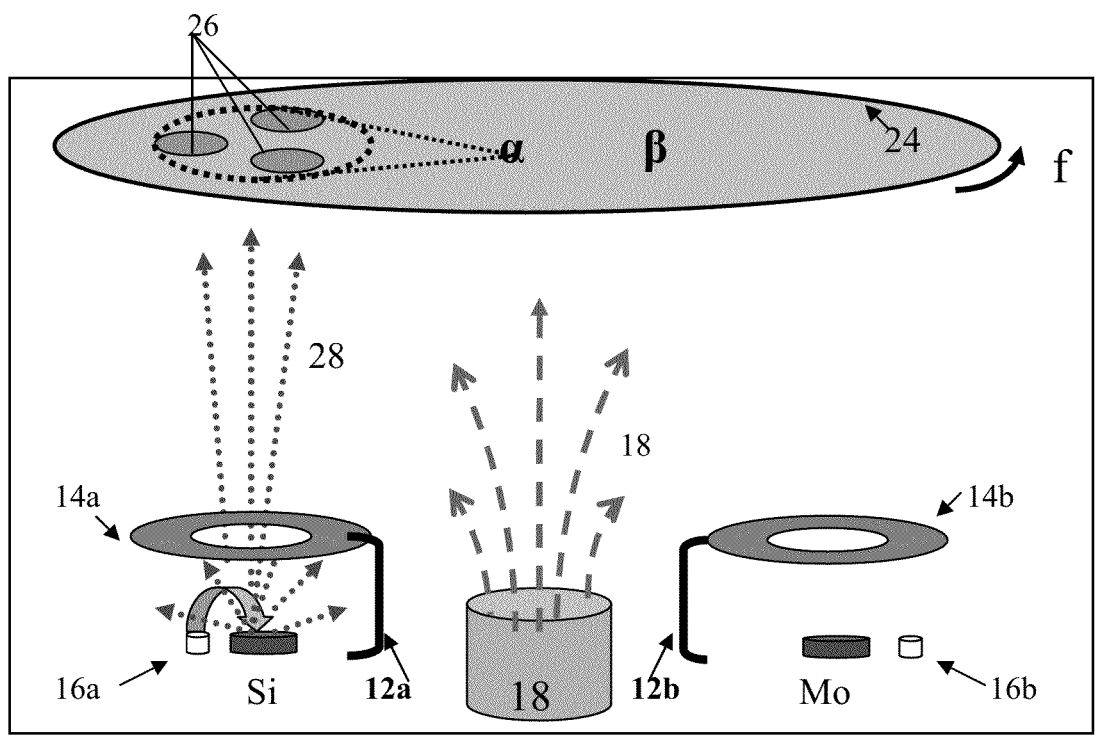
FIG. 4 Schematic drawing of modified PIAD for Mo/Si multilayer deposition with a set of reversed masks and side shields that enabling EUV coatings.

The method described herein makes used of side shields that are installed to protect the plasma source from metal contamination. The advantage of reversed masking technology is well recognized in oxide films as has bee described in U.S. Pat. No. 7,465,681 and U.S. Patent Application Publication No. 2009/0141358. Oxide films that have been described in these publications include including multilayers of $HfO_2/SiO_2$, $Al^2O_3/F$—$SiO_2$ and oxide-fluoride hybrid coatings. However, a problem appears when PIAD process is employed to deposit Mo/Si multilayer. As deposition process progresses, the deposited metal contaminates the advanced plasma source (APS), leading to arcing and damaging of the APS components. The solution for preventing metal contamination of the plasma source is to install a side shield between the electron beam evaporation source and the APS. FIG. 4 is a schematic illustration of a PIAD deposition apparatus 10 with a set of side shields installed. Illustrated in FIG. 4 are side shields 12a and 12b to prevent Si and Mo, respectively, from contaminating the plasma source, reverse masks 14a (for Si) and 14b (for Mo), electron guns (e-guns) 16a and 16b (for Si and Mo, respectively), advanced plasma source 18, Si source 20, Mo source 22, EUV optics carrier 24, and optic substrates 26. While the side shields 12a and 12b protect APS 18 from metal vapor contamination, the side shields do not effect plasma ion-assisted process which occurs on the top portion of the vacuum chamber where optics 26 are coated with layers of Mo and Si. In FIG. 4 as illustrated, e-gun 16a is turned on to create the Si vapor flux 28 and e-gun 16b is off (no Mo vapor is being formed).

Referring to FIG. 4, as had been indicated a reverse mask is used instead of a regular mask as is commonly used in lithography. A "regular mask" is a piece of material that is sitting above the depositing source which enables one to improve deposited film uniformity by changing its shape. A "reversed mask" is one in which the mask has a hole in the center. That is, a vapor flux 28 (as illustrated in FIG. 4), created by bombarding the coating material 14a with an e-beam from e-gun 12a, passes through a reversed mask 14a that restricts the flux to being deposited on the rotating optic substrates 26 in the restricted area α as illustrated in FIG. 4. The rotation of the substrates (rotation mechanism not illustrated) insures that with time the entire substrate will be coated with the coating material. Since the "α area" is in fact a stationary feature because it is defined by the flux deposition area, as the substrate rotates the deposited material leaves this area and eventually enter into the β area. When the coating is in the β area, the plasma ion "beam" impacts the coating, densifying and smoothing it. Deposition takes place only in area α, while plasma bombardment takes place in areas α and β. The plasma beam can be used while rotating the substrate for a selected time, the time generally being in the range of >0-10 minutes, preferably a time in the range of 1-5 minutes, prior to beginning the coating deposition to insure that the entire substrate surface is densified and smoothed prior to coating deposition. As the process proceeds, each layer of coating is impacted and densified. Owing to the rotation speed f (f is in the range of 10-30 rpm) and to the deposition rate (the deposition rate is in the range of 0.02 nm/sec to 0.04 nm/sec) the densification and smoothing is virtually on an atomic layer by atomic layer basis. An example of rotation speed and deposition rate as used herein is f=22 rpm and a deposition rate of 0.02 nm/sec. When a "regular mask" is used, the coating material flux is spread out such that all or substantially all of the substrate surface area is simultaneously coated. The plasma beam will impact the coating as it is deposited, and while this may densify the coating, it does not smooth it.

B. The Mo and Si Deposition Rates can be Precisely Controlled

In the process of forming layers of Mo and Si for DUV optics, the appropriate average deposition rate of each material is achieved by means of reversed masking technology as illustrated in FIG. 4, where zones α and β correspond to the mask un-shadowed and shadowed area, respectively. The details of the reversed masking technology is generally described in above and are further described in U.S. Pat. No. 7,465,681 and US Patent Application Publication No. 2009/0141358 where it has been used for oxide and oxide-fluoride hybrid coatings. In the present application the technology is extended to EUV Mo/Si multilayer coatings where individual layer thickness control accuracy needs to be in a tenth of a nanometer (0.1 nm). By reducing the openings in the reversed masks, an appropriate metal deposition rate is achieved in conjunction with electron beam power and the pattern settings of the PIAD coater.

Generally, the opening in the mask is related to the materials being used. For metal oxide and metal fluoride coatings having a thickness of, for example, greater than 20 nm, reversed masks having an opening in the range of approximately 50 mm×100 mm have been used. For coating materials such a Mo to a thickness of 3 nm a reversed mask having an opening of approximately 50 nm×100 nm is used. However, coating with Si a reversed mask having a similar opening size or a reverse mask having a smaller opening, for example, 40 mm×88 mm. In coating substrates to DUV application it important to precisely control the thickness of each layer being deposited. For DUV application the thickness of the layers should be controlled to ±0.1 nm, or less, of the targeted layer thickness to prevent spectral shift.

Figure 1:
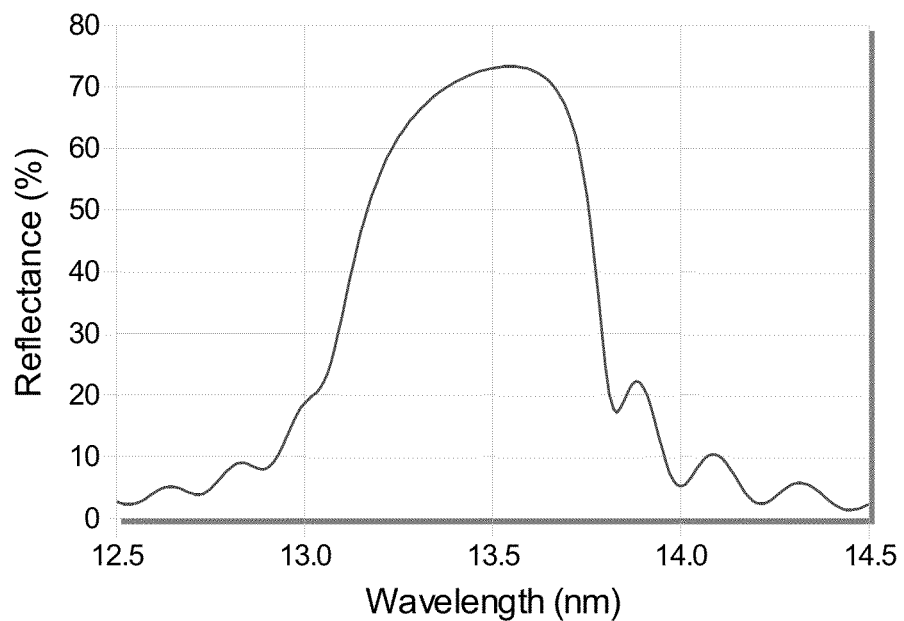
FIG. 1 Spectral reflectance of a EUV mirror at an angle of incidence of 8°, the mirror consisting of 60-peiods of Mo/Si in a multilayer structure.
Figure 2:
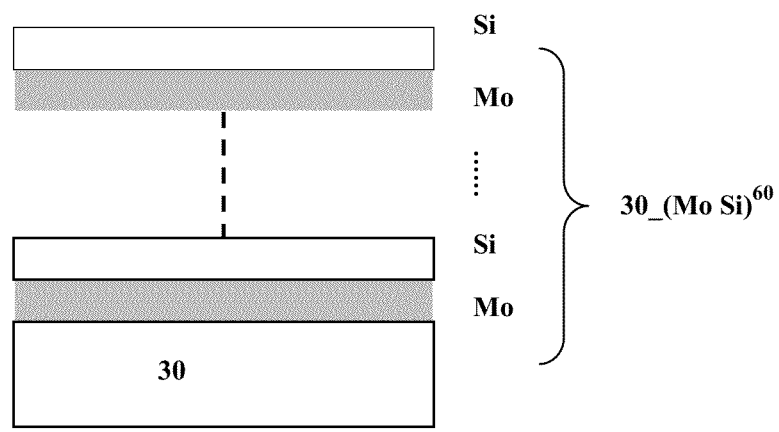
FIG. 2 Cross-sectional view of a EUV mirror with 60-peiod Mo/Si multilayer structure on a substrate 30, in which an individual layer thickness is 2.8 nm for Mo and 4.2 nm for Si.
Figure 3:
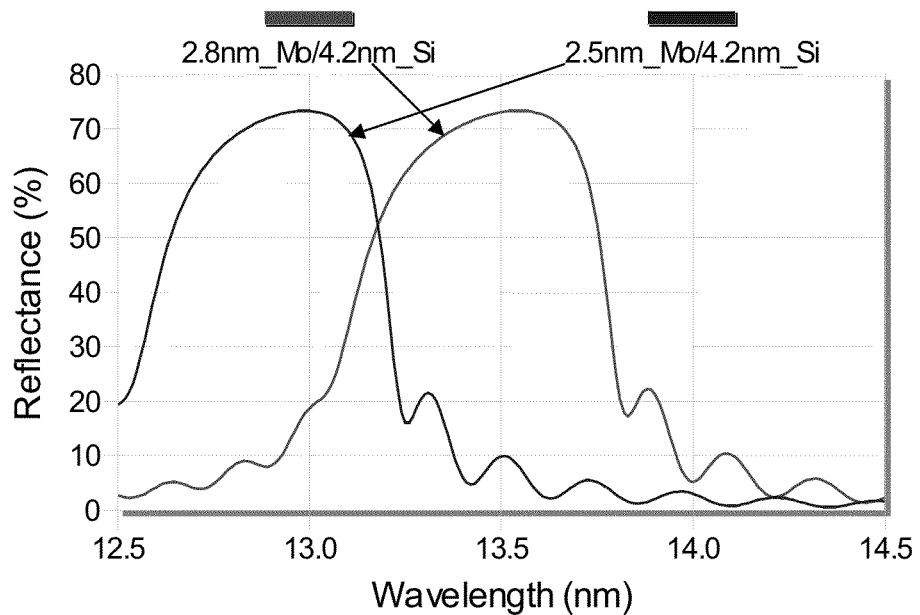
FIG. 3 Spectral reflectance of a 60-peiod Mo/Si EUV mirror with d Mo=2.5 nm d_Si=4.2 nm (blue curve), along with d_Mo=2.8 nm and d_Si=4.2 nm (red curve) for comparison.
Figure 9:
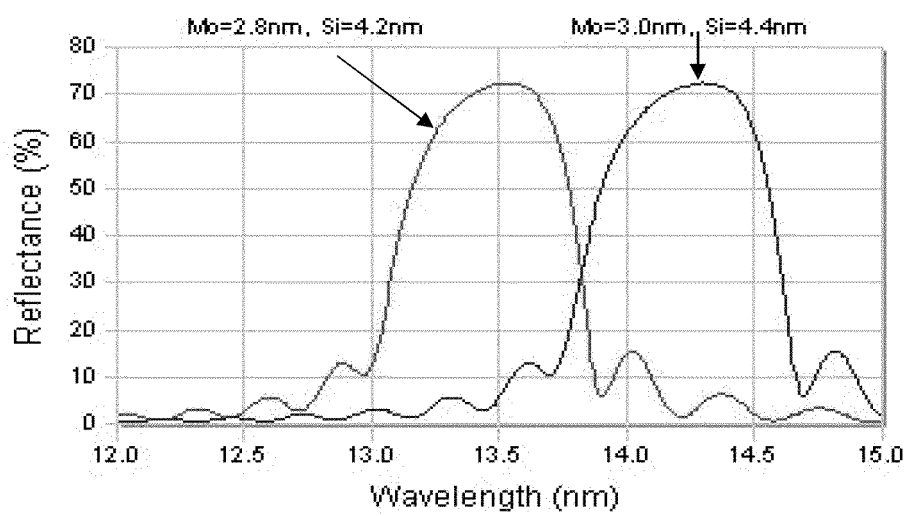
FIG. 9 is a graph illustrating the shift in the central wavelength for Mo/Si multilayer coatings having different Mo and Si layer thicknesses

FIGS. 8a and 8b are TEM (transmitting electron microscope) photographs illustrating Mo/Si coatings 40 placed on a substrate using reversed masks having different opening dimensions. In each FIG. 40 the dark lines are the Mo layer and the lighter lines are the Si layer. The light area 42 at the bottom is the substrate and the light area at the top (unnumbered) is background. In FIG. 8a the Mo/Si film was deposited using reverse masks with an opening of approximately 40 mm×88 mm, the deposited Mo layers having a thickness of 2.8 nm and the deposited Si layers having a thickness of 4.2 nm. In FIG. 8b the films were deposited using a mask having an opening of approximately 50 mm×100, the deposited Mo layer having a thickness of 3.0 m, and the deposited Si layer having a thickness of 4.4 nm. As seen by a comparison of the two TEM photographs, use of the mask with the larger opening results is greater variability of each layer that is deposited and in the thickness of the layers. In addition, referring to FIG. 9, when the thickness of each layer is varied by only +0.2 nm, the central wavelength shifts from 13.5 nm for the coating shown in FIG. 8a to approximately 14.3 nm for the coating shown in FIG. 8b. In FIG. 3, when the deposited Si layer thickness was constant at 4.2 nm and the deposited Mo layer thickness was decreased from 2.8 nm to 2.5 nm, the central wavelength shifted by −0.5 nm, from 13.5 to 13.0. These results are a clear indication of the control necessary to insure that the deposited coating falls within specification for the components operation at, for example 13.5 nm.

As has been indicated above, metal deposition only happens on substrates in the zone α whereas in-situ plasma smoothing and further densification occurs in the zone β. This coating process can be described by plasma momentum transfer per deposited atom P, which is the sum of momentum transfer in zone α ($P_\alpha$) and zone β ($P_\beta$) in units of $(a.u.\ eV)^{0.5}$ during coating, $$P = P_\alpha + P_\beta = \frac{1}{2\pi}\left(\frac{\alpha}{R}\kappa + \frac{\beta}{n_s f}\right) J_i \sqrt{2m_i e V_b} \quad (1)$$

where $V_b$ is the bias voltage, $J_i$ and $m_i$ are the plasma ion flux in ion/(cm² sec) and mass in a.u., respectively. R is the deposition rate in nm/sec. e is the electron charge, and k is a unit convert factor, $n_s$ is Mo or Si surface atom density in atom/cm². The terms α and β are the radian of mask shadowed and un-shadowed area of the vapor flux relative to the center of the rotated plate with a frequency of f. Adjustments of the mask shape and height, APS parameters, and plate rotation frequency enables one to separately control the amount of momentum transfer for plasma-assisted Mo/Si deposition and for in-situ plasma smoothing.

C. Enhance Plasma Smoothing and Film Packing Density

Figure 5:
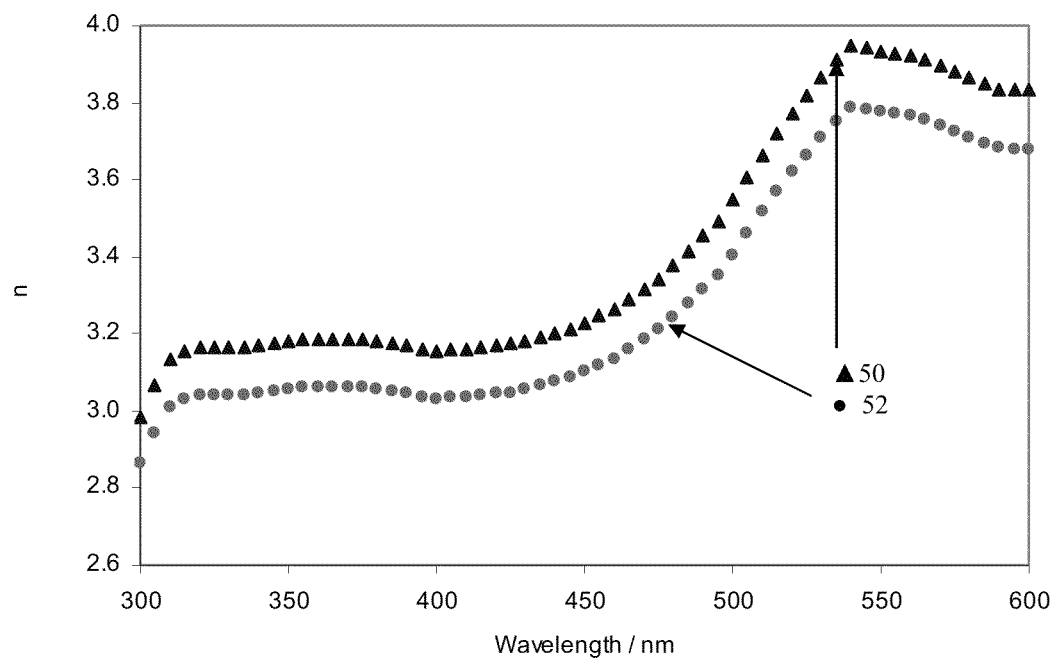
FIG. 5 Refractive index of a 5.6 nm thick Mo film deposited via the modified PIAD as a function of wavelength, compared to that of Mo bulk.
Figure 6:
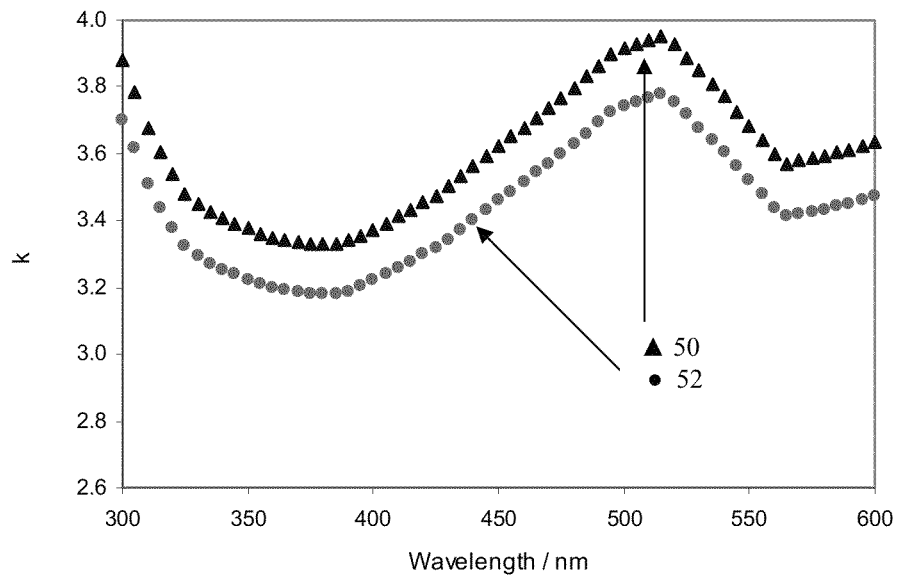
FIG. 6 Extinction coefficient of a 5.6 nm thick Mo film deposited via the modified PIAD as a function of wavelength, compared to that of Mo bulk.

By adjusting the ratio of β and α, not only is the Mo/Si layer thickness is precisely controlled, but in addition the in-situ plasma smoothing and the further densification effect is also enhanced as described in Eq. (1). The latter is a necessary to reduce scattering loss for EUV coatings. FIG. 5 is a graph of the refractive index n versus wavelength of a 5.6 nm thick Mo film (50, ▲) deposited using the modified PIAD, compared to that of Mo bulk (52, ●). FIG. 6 is a graph of extinction coefficient versus wavelength of a 5.6 nm thick Mo film (50, ▲) deposited via the modified PIAD as a function of wavelength, compared to that of Mo bulk (52, ●). The results suggest that the film packing density of the Mo film is 7% denser than that of Mo bulk material. Similar densification is also realized for Si films. FIG. 7 is an AFM image of a 60-peiod (or period) Mo/Si multilayer deposited via the modified PIAD. The 60 periods of Mo/Si correspond to total layer number of 120. The surface roughness determined by AFM is only 0.18 nm over a scanning area of 5 μm×5 μm.

Combining the 3 steps (A-C) mentioned above, this disclosure describes a new method that enables the use of the PIAD process for EUV Mo/Si multilayer coatings. The use of PIAD in place of magnetron sputtering, the method currently used for the deposition of Mo/Si reflective films, enables multimillion dollar savings in the equipment investment required if a magnetron sputtering system is used, and also a lot of time savings in the EUV coating process. Overall, the use of PIAD enables more parts per unit time period at a lower investment cost.

FIG. 5 is a graph illustrating the refractive index changes versus wavelength for a 5.6 nm thick Mo layer deposited using the PIAD method as described herein as compared to that of bulk Mo.

FIG. 6 is a graph of the extinction coefficient changes versus wavelength for a 5.6 nm thick Mo layer deposited using the PIAD method as described herein as compared to that of bulk Mo.

The disclosure has further benefits in additional lithographic areas. It is believed that it will benefit X-ray optics in addition to EUV optics due to the ability to precisely control the deposition of reflect materials on substrates. It will benefit DUV, UV, VIS and IR optics where high quality metal coating is required. In particular the disclosure will be important to the deposition of deposit high quality Au coatings as high reflective mirrors of $CO_2$ laser at 10.6μ for generating metal plasmas as light sources of EUV radiation.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

We claim:

1. An extreme-ultraviolet (EUV) lithography mirror suitable for operating in the 10-15 nm range, said mirror consisting of:

a selected substrate suitable for EUV lithography, said substrate having a plasma densified and smoothed surface, a coating on the densified and smoothed surface of the substrate, said coating consisting of 40-100 coating periods, each coating period consisting of a Mo layer of specified thickness in the range of 2 nm to 5 nm and an Si layer of specified thickness in the range of 2 nm to 5 nm, the deposited thickness of the Mo layer and the Si layer each being ±0.1 nm of the specified thickness, wherein the Mo layer is the first layer of each period and the Si layer is the second layer of each period; and the mirror has a reflectivity of greater than 70%.

2. The mirror according to claim 1, wherein the substrate is selected from the group consisting of fused silica glass and silica titania glass Zerodur™ and Zerodur™ K20.

3. The mirror according to claim 1, wherein the Mo layers have a predetermined thickness between 2.5 nm and 2.8 nm, and the Si layers have a thickness of 4.2 nm, each of said Mo and Si layers having a variation of ±0.1 nm, and said mirror has a reflectance of greater than 70% at a desired spectrally shifted wavelength between 12.7 nm and 13.7 nm.

* * * * *